United States Patent
Bhatia et al.

(10) Patent No.: US 8,716,154 B2
(45) Date of Patent: May 6, 2014

(54) REDUCED PATTERN LOADING USING SILICON OXIDE MULTI-LAYERS

(75) Inventors: Sidharth Bhatia, Menlo Park, CA (US); Paul Edward Gee, San Jose, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 13/251,621

(22) Filed: Oct. 3, 2011

(65) Prior Publication Data

US 2012/0225565 A1 Sep. 6, 2012

Related U.S. Application Data (60) Provisional application No. 61/449,148, filed on Mar. 4, 2011.

(51) Int. Cl.
*H01L 21/31* (2006.01)
*H01L 21/02* (2006.01)

(52) U.S. Cl.
CPC ................................. *H01L 21/0228* (2013.01)
USPC ........................................................ 438/790

(58) Field of Classification Search
CPC ................................................. H01L 21/0228
USPC ........................................................ 438/790
See application file for complete search history.

(56) References Cited

U.S. PATENT DOCUMENTS

| | | | |
|---|---|---|---|
| 4,147,571 A | 4/1979 | Stringfellow et al. | |
| 4,200,666 A | 4/1980 | Reinberg | |
| 4,816,098 A | 3/1989 | Davis et al. | |
| 4,818,326 A | 4/1989 | Liu et al. | |
| 4,910,043 A | 3/1990 | Freeman et al. | |
| 4,931,354 A | 6/1990 | Wakino et al. | |
| 4,946,593 A | 8/1990 | Pinigis | |
| 5,016,332 A | 5/1991 | Reichelderfer et al. | |

(Continued)

FOREIGN PATENT DOCUMENTS

| | | |
|---|---|---|
| DE | 19654737 A1 | 7/1997 |
| EP | 0892083 A1 | 1/1999 |

(Continued)

OTHER PUBLICATIONS

Alexandrov, S. E., et al., "Formation of Silicon Nitride Films by Remote Plasma-enhanced Chemical Vapour Deposition". Advanced Materials for Optics and Electronics, vol. 2, 301-312 (1993).

(Continued)

*Primary Examiner* — Ajay K Arora
(74) *Attorney, Agent, or Firm* — Kilpatrick Townsend & Stockton LLP (57) ABSTRACT

Aspects of the disclosure pertain to methods of depositing conformal silicon oxide multi-layers on patterned substrates. The conformal silicon oxide multi-layers are each formed by depositing multiple sub-layers. Sub-layers are deposited by flowing BIS(DIETHYLAMINO)SILANE (BDEAS) and an oxygen-containing precursor into a processing chamber such that a relatively uniform dielectric growth rate is achieved across the patterned substrate surface. A plasma treatment may follow formation of sub-layers to further improve conformality and to decrease the wet etch rate of the conformal silicon oxide multi-layer film. The deposition of conformal silicon oxide multi-layers grown according to embodiments have a reduced dependence on pattern density while still being suitable for non-sacrificial applications.

19 Claims, 5 Drawing Sheets

(56) References Cited

U.S. PATENT DOCUMENTS

| | | |
|---|---|---|
| 5,110,407 A | 5/1992 | Ono et al. |
| 5,212,119 A | 5/1993 | Hah et al. |
| 5,271,972 A | 12/1993 | Kwok et al. |
| 5,279,784 A | 1/1994 | Bender et al. |
| 5,364,488 A | 11/1994 | Minato et al. |
| 5,393,708 A | 2/1995 | Hsia et al. |
| 5,426,076 A | 6/1995 | Moghadam |
| 5,434,109 A | 7/1995 | Geissler et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Iyechika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,926,737 A | 7/1999 | Ameen et al. |
| 5,935,340 A | 8/1999 | Xia et al. |
| 5,937,308 A | 8/1999 | Gardner et al. |
| 5,937,323 A | 8/1999 | Orczyk et al. |
| 5,961,850 A | 10/1999 | Satou et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,110,838 A | 8/2000 | Loewenstein |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,150,286 A | 11/2000 | Sun et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,207,587 B1 | 3/2001 | Li et al. |
| 6,211,040 B1 | 4/2001 | Liu et al. |
| 6,258,690 B1 | 7/2001 | Zenke |
| 6,287,962 B1 | 9/2001 | Lin |
| 6,296,255 B1 | 10/2001 | Hashimoto |
| 6,302,964 B1 | 10/2001 | Umotoy et al. |
| 6,339,997 B1 | 1/2002 | Nakagawa et al. |
| 6,355,581 B1 | 3/2002 | Vassiliev et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Khan et al. |
| 6,583,069 B1 | 6/2003 | Vassiliev et al. |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,849,520 B2 | 2/2005 | Kim et al. |
| 6,858,523 B2 | 2/2005 | Deboer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,875,687 B1 | 4/2005 | Weidman et al. |
| 6,890,403 B2 | 5/2005 | Cheung |
| 6,900,067 B2 | 5/2005 | Kobayashi et al. |
| 6,955,836 B2 | 10/2005 | Kumagi et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,514,375 B1 | 4/2009 | Shanker et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,622,369 B1 | 11/2009 | Lee et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |

(56) References Cited

U.S. PATENT DOCUMENTS

| | | |
|---|---|---|
| 7,867,923 B2 | 1/2011 | Mallick et al. |
| 7,902,080 B2 | 3/2011 | Chen et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 | 6/2013 | Wang et al. |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0027286 A1 | 3/2002 | Sundararajan et al. |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0119607 A1* | 8/2002 | Miyasaka et al. ............ 438/151 |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0160585 A1* | 10/2002 | Park ............................ 438/507 |
| 2002/0164421 A1 | 11/2002 | Chiang et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 | 11/2003 | Dubin et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0082131 A1 | 4/2004 | Tsujikawa et al. |
| 2004/0084680 A1 | 5/2004 | Ruelke et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216844 A1 | 11/2004 | Janakiraman et al. |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0241342 A1 | 12/2004 | Karim et al. |
| 2004/0253826 A1 | 12/2004 | Ivanov et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0042889 A1 | 2/2005 | Lee et al. |
| 2005/0062165 A1 | 3/2005 | Saenger et al. |
| 2005/0087140 A1 | 4/2005 | Yuda et al. |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0160974 A1 | 7/2005 | Ivanov et al. |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0011984 A1 | 1/2006 | Currie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0158101 A1 | 7/2006 | Camilletti et al. |
| 2006/0159847 A1 | 7/2006 | Porter et al. |
| 2006/0160372 A1 | 7/2006 | Dorfman |
| 2006/0162661 A1 | 7/2006 | Jung et al. |
| 2006/0178018 A1 | 8/2006 | Olsen |
| 2006/0211265 A1 | 9/2006 | Trott |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |

(56) References Cited

U.S. PATENT DOCUMENTS

| | | |
|---|---|---|
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0070409 A1 | 3/2008 | Park et al. |
| 2008/0081104 A1* | 4/2008 | Hasebe et al. ............... 427/58 |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat et al. |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0142935 A1 | 6/2009 | Fukazawa et al. |
| 2009/0170282 A1 | 7/2009 | Dong |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0206409 A1 | 8/2009 | Arisumi et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0052066 A1 | 3/2010 | Yu et al. |
| 2010/0059889 A1 | 3/2010 | Gosset et al. |
| 2010/0081094 A1 | 4/2010 | Hasebe et al. |
| 2010/0081293 A1 | 4/2010 | Mallick et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1* | 9/2010 | Mizuno ........................ 430/312 |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0074387 A1 | 3/2012 | King |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0122302 A1 | 5/2012 | Weidman et al. |
| 2012/0142192 A1 | 6/2012 | Li et al. |
| 2012/0145079 A1 | 6/2012 | Lubomirsky et al. |
| 2012/0161405 A1 | 6/2012 | Mohn et al. |
| 2012/0177846 A1 | 7/2012 | Li et al. |
| 2012/0190178 A1 | 7/2012 | Wang et al. |
| 2012/0193778 A1 | 8/2012 | Mawatari |
| 2012/0213940 A1 | 8/2012 | Mallick |
| 2012/0238108 A1 | 9/2012 | Chen et al. |
| 2012/0269989 A1 | 10/2012 | Liang et al. |
| 2012/0292720 A1 | 11/2012 | Chen et al. |
| 2012/0309205 A1 | 12/2012 | Wang et al. |
| 2013/0062736 A1 | 3/2013 | Brighton et al. |
| 2013/0084711 A1 | 4/2013 | Liang et al. |
| 2013/0149462 A1 | 6/2013 | Liang et al. |
| 2013/0193578 A1 | 8/2013 | Yu et al. |

FOREIGN PATENT DOCUMENTS

| | | |
|---|---|---|
| EP | 1095958 B1 | 5/2001 |
| EP | 1717848 A | 11/2006 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 2004-328825 | 11/1992 |
| JP | 05-259156 | 10/1993 |
| JP | 05-304147 A | 11/1993 |
| JP | 06-077150 A | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 10-163183 A | 6/1998 |

(56) References Cited

FOREIGN PATENT DOCUMENTS

| | | |
|---|---|---|
| JP | 11-274285 A | 10/1999 |
| JP | 2001-148382 A | 5/2001 |
| JP | 2002-370059 A | 12/2002 |
| JP | 2003-179054 | 6/2003 |
| JP | 2004-012315 | 1/2004 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-0003758 A | 1/2005 |
| KR | 1020060081350 A | 1/2005 |
| KR | 10-2005-0072332 | 7/2005 |
| KR | 10-2005-0085838 | 8/2005 |
| KR | 10-2005-0094183 A | 9/2005 |
| KR | 10-2009-0011765 A | 2/2009 |
| KR | 10-2009-0121361 | 11/2009 |
| KR | 10-2009-0122860 A | 12/2009 |
| KR | 10-2010-0085743 | 7/2010 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |
| WO | 2009/055340 A1 | 4/2009 |
| WO | 2010/080216 | 7/2010 |
| WO | 2013/145148 A2 | 10/2012 |
| WO | 2013/025336 | 2/2013 |

OTHER PUBLICATIONS

Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.
International Search Report and Written Opinion of PCT/US2011/054635, mailed Jul. 9, 2012, 11 pages.
International Search Report and Written Opinion of PCT/US2011/054981, mailed May 9, 2012, 10 pages.
International Search Report and Written Opinion of PCT/US2011/054984, mailed May 11, 2012, 10 pages.
International Search Report and Written Opinion of PCT/US2011/066601, mailed Jul. 20, 2012, 10 pages.
Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.
Aylett, B. J. et al., "Silicon-Nitrogen Compounds. Part V. Diphenylamino-derivatives of Silane," J. Chem. Soc. (A), Apr. 1969, pp. 636-638.
Aylett, B. J. et al., "Silicon-Nitrogen Compounds. Part VI. The Preparation and Properties of Disilazane," J. Chem. Soc. (A), Apr. 1969, pp. 639-642.
Aylett, B. J. et al., "The Preparation and Some Properties of Disilylamine-Correspondence," Inorganic Chemistry, Jan. 1966, p. 167.
Beach, David B., "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.
Burg, Anton B. et al., "Silyl-Amino Boron Compounds," J. Amer. Chem. Soc., Jul. 1950, pp. 3103-3107, vol. 72.
Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.
Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.
Gulleri, G. et al., "Deposition Temperature Determination of HDPCVD Silicon Dioxide Films," 2005, Microelectronic Engineering, vol. 82, pp. 236-241.
Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.
Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.
Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.
Norman, Arlan D. et al., "Reaction of Silylphosphine with Ammonia," Inoragnic Chemistry, Jun. 1979, pp. 1594-1597, vol. 18 No. 6.
Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.
Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.
Ward, L. G. L. et al., "The Preparation and Properties of *Bis*-Disilanyl Sulphide and *Tris*-Disilanylamine," J. Inorg. Nucl. Chem., Dec. 1961, pp. 287-293, vol. 21, Pergamon Press Ltd., Northern Ireland.
Ward, Laird G. L., "Bromosilane, Iodosilane, and Trisilyamine," Inorganic Syntheses, 1968, pp. 159-170, vol. 11.
Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.
Franz, et al., "Conversion of silicon nitride into silicon dioxide through the influence of oxygen," Solid-State Electronics, Jun. 1971, pp. 449-505, vol. 14, Issue 6, Germany. Abstract Only.
International Search Report and Written Opinion of PCT/US2011/066275, mailed Sep. 24, 2012, 9 pages.
International Search Report and Written Opinion of PCT/US2012/026786, mailed Jan. 2, 2013, 7 pages.
International Search Report and Written Opinion of PCT/US2012/031640 mailed Oct. 18, 2012, 10 pages.
International Search Report and Written Opinion of PCT/US2012/039629, mailed Dec. 26, 2012, 6 pages.
Tripp, et al., "The Anodic Oxidation of Silicon Nitride Films on Silicon," Journal of the Electrochemical Society, 1970, pp. 157-159, 117(2).
Usenko, et al., "Silicon Nitride Surface Conversion into Oxide to Enable Hydrophilic Bonding," ECS Meeting Abstracts, 2010, 1 page, Abstract #1716, 218th ECS Meeting.
International Search Report and Written Opinion of PCT/US2012/053999, mailed Feb. 27, 2013, 12 pages.
International Search Report and Written Opinion of PCT/US2012/065086, mailed Mar. 25, 2013, 10 pages.
International Search Report and Written Opinion of PCT/US2012/059400, mailed Mar. 26, 2013, 11 pages.
Wang Li et al., "Properties of Hydrogenated Amorphous Silicon Caarbide Films Irradiated by Excimer Pulse Laser," 1998, Abstract Only.
Ying-Yu et al., "Preparation of SiC Thin Film Using Organosilicon by Remote Plasma CVD Method," 1999, Abstract Only.

\* cited by examiner

REDUCED PATTERN LOADING USING SILICON OXIDE MULTI-LAYERS

CROSS-REFERENCES TO RELATED APPLICATIONS

This application claims the benefit of U.S. Prov. Pat. App. No. 61/449,148 filed Mar. 4, 2011, and titled "REDUCED PATTERN LOADING USING SILICON OXIDE MULTI-LAYERS," which is incorporated herein by reference for all purposes.

BACKGROUND OF THE INVENTION

Forming dielectric layers on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques. CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Dielectric layers that are used for applications such as barrier layers and spacers are typically deposited over features, e.g., horizontal interconnects for subsequently formed lines, vertical interconnects (vias), gate stacks, etc., in a patterned substrate. Preferably, the deposition provides a conformal layer. However, it is often difficult to achieve conformal deposition as the barrier layer formed over a feature may have surface defects including uneven thickness. During deposition, the barrier layer material may overloaf, that is, deposit excess material on the shoulders of a via and deposit too little material in the base of the via, forming a shape that looks like the side of a loaf of bread. In extreme cases, the shoulders of a via may merge to form a joined, sealed surface across the top of the via. The film thickness non-uniformity across the wafer can negatively impact the drive current improvement from one device to another. Modulating the process parameters alone does not significantly improve the step coverage and pattern loading problems.

Deposition of conformal layers over gate stacks to provide layers that are subsequently etched to form spacers is also challenging. While methods of depositing silicon nitride and silicon oxide layers for spacers using high temperature, low pressure conventional CVD have been developed, the thermal budget for such techniques is becoming too high as semiconductor device geometry continues to shrink. PECVD processes of silicon nitride and silicon oxide deposition can be performed at lower temperatures, but the step coverage and pattern loading results are not as desirable as those obtained with high temperature, low pressure CVD.

Therefore, a need exists for more conformal methods of depositing dielectric films over features in a patterned substrate.

BRIEF SUMMARY OF THE INVENTION

Aspects of the disclosure pertain to methods of depositing conformal silicon oxide multi-layers on patterned substrates. The conformal silicon oxide multi-layers are each formed by depositing multiple sub-layers. Sub-layers are deposited by flowing BIS(DIETHYLAMINO)SILANE (BDEAS) and an oxygen-containing precursor into a processing chamber such that a relatively uniform dielectric growth rate is achieved across the patterned substrate surface. A plasma treatment may follow formation of sub-layers to further improve conformality and to decrease the wet etch rate of the conformal silicon oxide multi-layer film. The deposition of conformal silicon oxide multi-layers grown according to embodiments have a reduced dependence on pattern density while still being suitable for non-sacrificial applications.

Embodiments of the invention include methods for forming a conformal silicon oxide multi-layer on a patterned substrate in a substrate processing region of a processing chamber. The patterned substrate has a densely patterned region and a sparsely patterned region. The method comprising the sequential steps (1) performing a first cycle of chemical vapor deposition comprising the operations: flowing BDEAS into the substrate processing region, flowing a first oxygen-containing precursor into the substrate processing region, and forming a first conformal silicon oxide sub-layer of the conformal silicon oxide multi-layer on the patterned substrate from the BDEAS and the oxygen-containing precursor by chemical vapor deposition. The method further includes (2) removing unreacted and partially-reacted precursors from the substrate processing region. The method further includes (3) performing a second cycle of chemical vapor deposition comprising the operations: flowing BDEAS into the substrate processing region, flowing a second oxygen-containing precursor into the substrate processing region, forming a second conformal silicon oxide sub-layer of the conformal silicon oxide multi-layer on the patterned substrate from the BDEAS and the oxygen-containing precursor by chemical vapor deposition. The thickness of the first conformal silicon oxide sub-layer is about 100 Å or less.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

DETAILED DESCRIPTION OF THE INVENTION

Aspects of the disclosure pertain to methods of depositing conformal silicon oxide multi-layers on patterned substrates. The conformal silicon oxide multi-layers are each formed by depositing multiple sub-layers. Sub-layers are deposited by flowing BIS(DIETHYLAMINO)SILANE (BDEAS) and an oxygen-containing precursor into a processing chamber such that a relatively uniform dielectric growth rate is achieved across the patterned substrate surface. A plasma treatment may follow formation of sub-layers to further improve conformality and to decrease the wet etch rate of the conformal silicon oxide multi-layer film. The deposition of conformal silicon oxide multi-layers grown according to embodiments have a reduced dependence on pattern density while still being suitable for non-sacrificial applications.

Embodiments of the invention are directed to methods of forming silicon oxide on a patterned surface of a substrate. Sub-atmospheric CVD (SACVD) and related processes involve flowing a silicon-containing precursor and an oxidizing precursor into a processing chamber to form silicon oxide on the substrate. The silicon-containing precursor may include TEOS and the oxidizing precursor may include ozone ($O_3$), oxygen ($O_2$) and/or oxygen radicals. The inventors have discovered that forming silicon oxide multi-layers in combination with using BDEAS as the silicon-containing precursor reduces the pattern-loading effect (PLE) of the deposited silicon oxide.

Without binding the claim coverage with hypothetical mechanisms which may or may not be entirely correct, it is still beneficial to describe effects which may be occurring during the formation of the conformal silicon oxide multi-layer. BDEAS is more reactive than TEOS and other alternative silicon-containing precursors but relies more heavily on the presence of the oxygen-containing precursor due to the absence of oxygen within BDEAS. The combination of BDEAS and oxygen ($O_2$) preferentially reacts at or near the surface resulting in a deposition rate roughly proportional to the exposed surface area. This behavior is likely the cause of the desirable conformality reported herein. As the chemical reactions proceed, the chemical species in the near-surface area change over time. The inventors have found that the silicon oxide film becomes less conformal as the deposition proceeds. In order to regain the favorable surface-limited reaction, reacted and partially reacted chemical species may be removed from the substrate processing region and deposition may be restarted. Periodic removal of the reacted species may give rise to a growth process more uniformly dominated by surface reactions so that higher surface area regions of a patterned substrate receive additional deposition relative to lower surface area regions. The additional deposition results in a relatively constant film thickness across a patterned substrate having both high feature density areas and relatively open areas.

Figure 1:
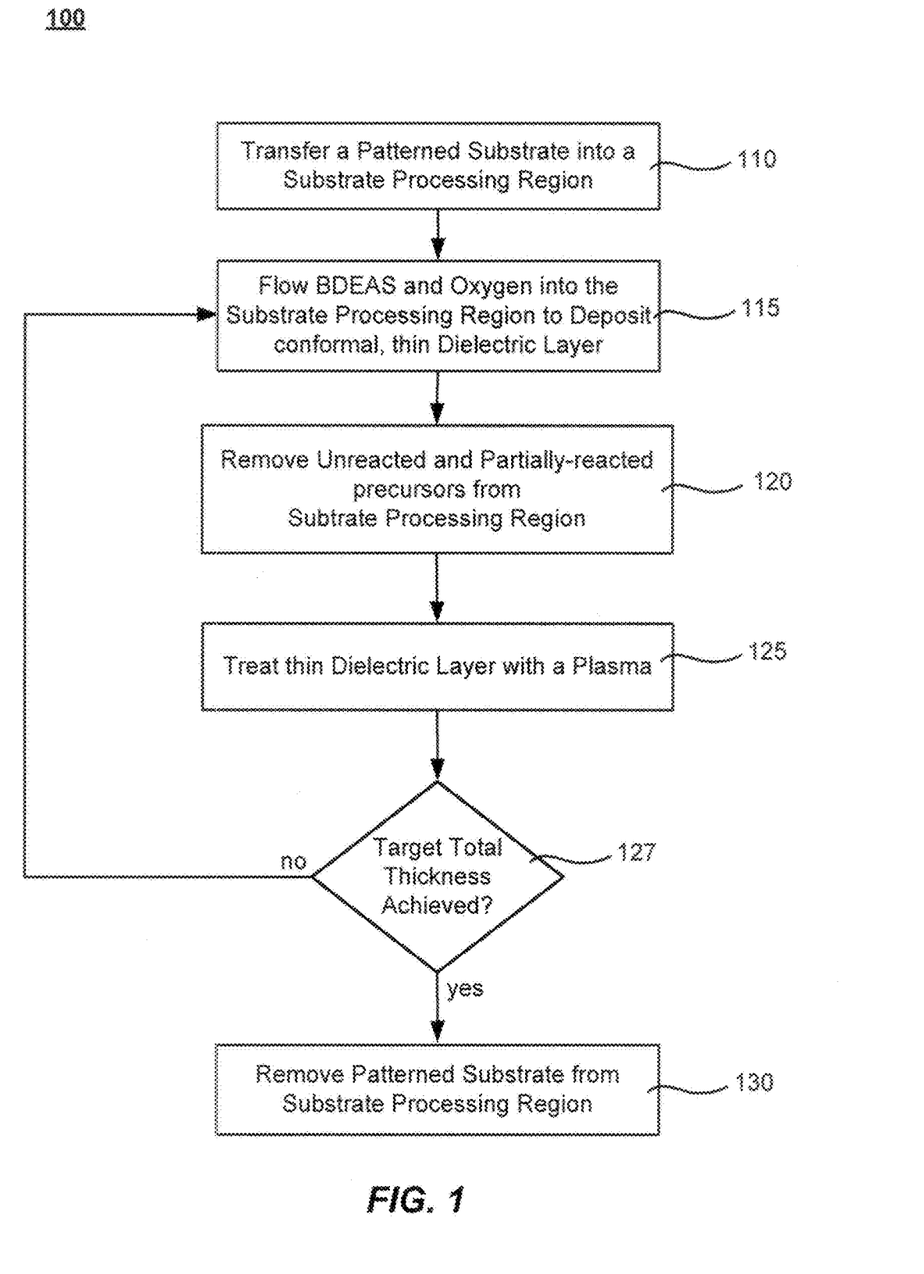
FIG. 1 is a flow chart of a conformal silicon oxide deposition process according to disclosed embodiments.

In order to better understand and appreciate the invention, reference is now made to FIG. 1 which is a flow chart of a conformal silicon oxide deposition process according to disclosed embodiments. The process begins when a patterned substrate is transferred into a substrate processing region (operation 110). BDEAS and an oxygen-containing precursor are flowed into the region in operation 120 and a conformal layer of silicon oxide is formed in operation 130. In some embodiments, the oxygen-containing precursor comprises molecular oxygen ($O_2$). In other embodiments, the oxygen-containing precursor comprises both molecular oxygen ($O_2$) and ozone ($O_3$). The flow rate of BDEAS may be less than one of 4 grams per minute (g/min), 3 g/min, 2 g/min, 1 g/min or 500 mg/min, in disclosed embodiments, to reduce the consumption of BDEAS which is not incorporated into the conformal silicon oxide film. The flow rate of BDEAS may be greater than one of 100 mg/min, 200 mg/min, 300 mg/min, 500 mg/min and 800 mg/min, in disclosed embodiments, to maintain productive growth rates of the conformal silicon oxide film. Additional embodiments result from the combination of one of the upper limits with one of the lower limits.

The flow of BDEAS may be brought about by bubbling a relatively inert carrier gas like nitrogen ($N_2$) through a liquid supply of BDEAS and delivering a combination of nitrogen and BDEAS to the substrate processing region. The flow rate of nitrogen or a similar gas may be several tens of standard liters per minute (slms). Essentially no plasma power is applied to the substrate processing region during operation 115, in embodiments, since the precursors react in the favorable surface-limited manner without plasma excitation.

Unreacted and partially-reacted precursors are generated and linger near the patterned substrate, inhibiting highly conformal growth especially beyond a certain thickness of a deposited sub-layer of silicon oxide. Unreacted and partially-reacted precursors are removed from the substrate processing region (operation 120) to allow future deposition cycles to be more conformal. An optional plasma treatment (operation 125) may be used to densify the conformal silicon oxide layer prior to additional deposition. In some embodiments, the optional plasma treatment is not used. Once the desired thickness of silicon oxide is achieved, the patterned substrate may be removed from the substrate processing region (operation 130). The decision to terminate or continue depositing additional sub-layers is made in operation 127. If additional deposition is desired or required for a certain application, deposition begins again (operation 115). The formation of a conformal silicon oxide multi-layer may involve the deposition of two, three, four, five (or more) conformal sub-layers, in disclosed embodiments.

The plasma treatment (operation 125) may follow none, some or each of the sub-layer depositions (operation 115). Each sub-layer deposition may be referred to herein as a "cycle" of chemical vapor deposition. The combined deposition of two cycles may be described as a first and second cycle of deposition. Additional cycles may be used depending on the conformality and/or thickness required for the combined deposition. Plasma treatment involves introducing a plasma treatment gas into the substrate processing region during or after the removal of the unreacted and partially-reacted precursors (operation 120). The plasma treatment gas comprises one or more of argon, helium, ozone or nitrogen ($N_2$), in disclosed embodiments. Other gases may also be used. The optional inclusion of plasma treatment (operation 125) serves to densify the sub-layer prior to removing the substrate or proceeding with additional deposition. The plasma treatment has been found to be more effective for thinner sub-layers. Sub-layer thicknesses are described herein following the plasma treatment, in the event that a plasma treatment is employed. Sub-layer thicknesses may be less than or about 100 Å, less than or about 50 Å or less than or about 35 Å, in embodiments of the invention. The plasma power is applied to the substrate processing region so the plasma may be described as local. For a 300 millimeter diameter circular substrate, plasma power may be greater than 300 Watts, between 300 Watts and 1500 Watts or between 400 Watts and 1000 Watts in embodiments of the invention. Appropriate correction is required for substrates having a different exposed area used for deposition. Plasma frequencies of several hundred kilohertz (e.g. 350 kHz) appear to have reduced effect than higher frequencies (13.6 MHz). The plasma excitation frequency is greater than or about 5 MHz or about 13.6 MHz, in embodiments of the invention. Microwave frequencies may also densify conformal silicon oxide sub-layers.

Characteristics of the formation of silicon oxide depend similarly on the flow rates of oxygen ($O_2$) and BDEAS. Increasing the flow rate of oxygen ($O_2$) from a small value results in an increase in deposition rate. The deposition rate plateaus after a threshold value of the oxygen flow rate is reached. The flow rate of oxygen ($O_2$) may be less than one of 40 standard liters per minute (slm), 30 slm, 25 slm, 20 slm or 15 slm, in disclosed embodiments, to increase the efficient use of oxygen thereby reducing the consumption of oxygen which is not incorporated into the conformal silicon oxide film. The flow rate of oxygen ($O_2$) may be greater than one of 5 slm, 10 slm, 15 slm, 20 slm and 25 slm, in disclosed embodiments, to maintain productive growth rates of the conformal silicon oxide film. Additional embodiments result from the combination of one of the upper limits with one of the lower limits.

The dependence on ozone ($O_3$) has a different character. A relatively small concentration of ozone promotes growth rate while maintaining conformality by ensuring surface resident deposition reactions. High flows of ozone undesirably increase the pattern loading effect (PLE). In some embodiments of the invention, essentially no ozone is flowed into the substrate processing region. When employed, the flow rate of ozone is accompanied by molecular oxygen, but the flow rates given here include only the ozone contribution to the total flow rate. The flow rate of ozone ($O_3$) may be less than one of 1 slm, 500 sccm, 300 sccm, 200 sccm, 150 sccm, 100 sccm and 70 sccm, in order to avoid a relatively high pattern loading effect. The lower the ozone flow rate, the less the pattern loading effect. The restricted flow of a precursor is sometimes referred to as a choked flow. In this case, the choked flow of ozone may substantially confine the reaction closer to or on the patterned substrate surface, thereby promoting a uniform deposition regardless of the local exposed pattern area density.

The flows of $O_3$, $O_2$ and BDEAS as described above are concurrent, in disclosed embodiments. Flow rates, as used herein, are not necessarily constant during the process. Flow rates of the different precursors may be initiated and terminated in different orders and their magnitudes may be varied. As such, concurrent does not mean that all three flows initiate and terminate together. Concurrent, as used herein, means that a period of time exists during the deposition in which all three flows are non-zero. In disclosed embodiments, all three precursor flows are non-zero for the duration of a deposition process. Unless otherwise indicated, mass flow rate magnitudes indicated herein are given for the approximate peak flow rate used during the process. Flow rate magnitudes indicated herein are for deposition on one side of a pair of 300 mm diameter wafers (area approximately 1400 cm$^2$). Appropriate correction based on deposition area is needed for a different number of wafers, larger or smaller wafers, double sided deposition or deposition on alternative geometry substrates (e.g. rectangular substrates).

The pressure in the substrate processing region during deposition of each silicon oxide sub-layer may be less than for many SACVD and HARP processes (e.g. 600 Torr) due to the reactivity of BDEAS. The pressure during the formation of the conformal silicon oxide sub-layers may be less than one of 350 Torr, 300 Torr, 250 Torr, 200 Torr or 150 Torr, in disclosed embodiments, to lessen the risk of uncontrolled reaction. The pressure may be greater than one of 50 Torr, 100 Torr, 150 Torr or 200 Torr, in disclosed embodiments, to maintain productive growth rates. Additional embodiments result from the combination of an upper limits with a lower limit.

The substrate temperature is below a threshold value, in embodiments, also to ensure that the reactions associated with deposition of silicon oxide sub-layers proceed near or on the surface of the patterned substrate. The temperature of the substrate during the deposition of the conformal silicon oxide is below one of 400° C., 375° C., 350° C., 325° C. and 300° C., in disclosed embodiments. No plasma is present in the substrate processing region during deposition in embodiments. A small ac and/or dc voltage may be applied to the substrate processing region without detriment to the benefits of the deposition process, according to embodiments. Such an excitation should not be considered to deviate from the scope of "essentially" plasma-free or a process having "essentially" no plasma as may be recited in some claims.

Supplying a choked flow of ozone along with TEOS also forms a conformal layer of silicon oxide. However, the film formed thereby possesses greater porosity and a high wet etch rate. Conformal silicon oxide multi-layers formed using BDEAS have greater density and comparatively lower wet etch rate. The wet etch rate of silicon oxide multi-layers formed according to disclosed embodiments possess wet etch rates (using a 1% HF solution) of less than one of 6, 5, 4, 3 or 2.5 times the wet etch rate of a thermally grown silicon oxide layer, in disclosed embodiments. The greater density and lower wet etch rate of conformal silicon oxide films grown in disclosed embodiments presented herein enables the conformal silicon oxide films (or portions thereof) to be incorporated into finished devices. More porous films, such as those grown with choked ozone and TEOS at low substrate temperature, must generally be removed due to the less resilient structure. As such, material grown using BDEAS and ozone may be left on the patterned substrate during subsequent processing.

During the removal of unreacted and partially-reacted precursors (operation 120) the flow of BDEAS may be terminated to allow deposition reaction by-products to be removed from the processing region. The pressure in the chamber is reduced during or following the removal of the unreacted and partially-reacted precursors (operation 120) in embodiments of the invention. The reduced pressures ensure that the by-product concentration is reduced sufficiently to restore the conformality of subsequently deposited sub-layers. Alternatively, the plasma treatment gas may be flowed into the substrate processing region to displace the unreacted and partially-reacted precursors. Regardless of the method of removal, the partial pressure of BDEAS within the substrate processing region may be reduced to below or about 10%, below or about 5% or below or about 3% of the partial pressure of BDEAS during the operation of flowing BDEAS and the oxygen-containing precursor, in embodiments of the invention. The partial pressure of BDEAS present in the substrate processing region is an indicator of the concentration of the concentration of unreacted and partially-reacted precursors residing in the near surface region.

The pressure in the substrate processing region during the plasma treatment (operation 125) of one, some or each silicon oxide sub-layer may be less than 50 Torr, 20 Torr, 10 Torr, or 8 Torr, in disclosed embodiments. The pressure may be greater than one of 1 Torr, 2 Torr, 3 Torr or 4 Torr, in disclosed embodiments. Additional embodiments of the invention result from the combination of an upper limits with a lower limit.

Figure 2:
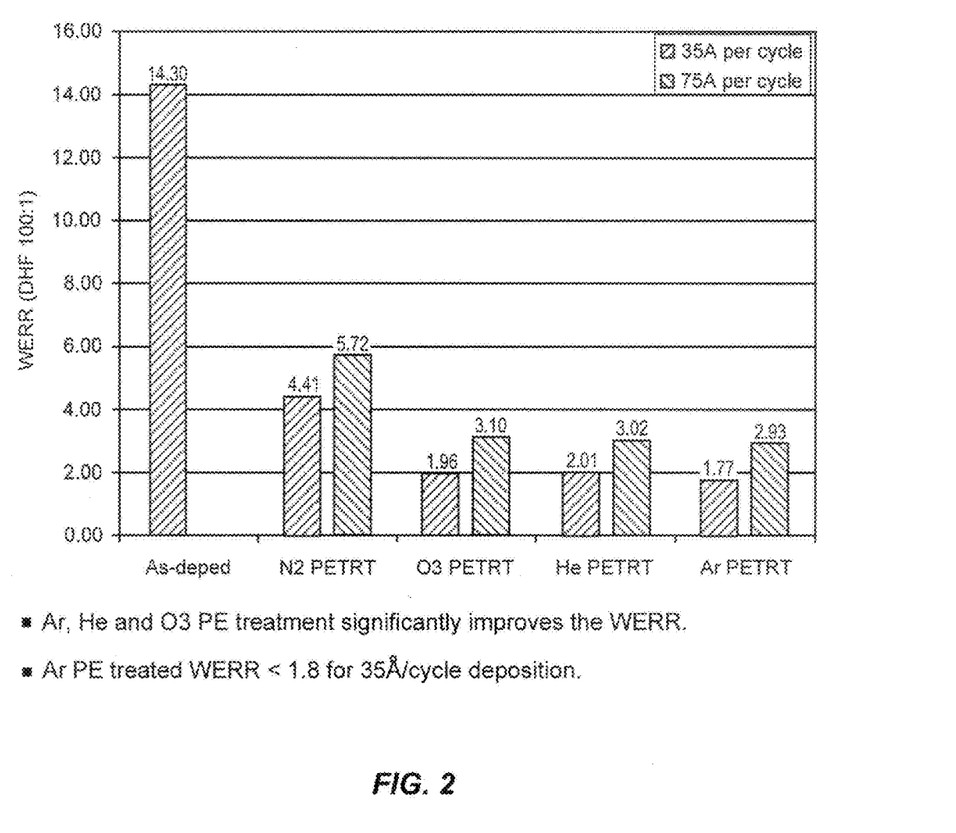
FIG. 2 is a chart of wet etch rate ratio (WERR) of conformal silicon oxide deposited according to disclosed embodiments.

FIG. 2 is a chart of wet etch rate ratio (WERR) of conformal silicon oxide deposited according to disclosed embodiments. Conformal silicon oxide multi-layers were formed without an intervening plasma treatment (operation 125) with each sub-layer measuring about 35 Å. The wet etch rate ratio was measured to be 14.30. The wet etch rate ratio in each of the measurements was determined by comparing the etch rate of the conformal silicon oxide multi-layer and dividing by the wet etch rate of thermally grown silicon oxide. Thermally grown silicon oxide is a very high density form of silicon oxide having the lowest known etch rate in a hydrofluoric acid solution. In these experiments a 1% hydrofluoric acid solution in water was used to etch the silicon oxide multi-layers.

A conformal silicon oxide multi-layer was also grown with an intervening plasma treatment formed from nitrogen ($N_2$) and sub-layers of 35 Å thickness. The WERR was measured to be 4.41. A similarly prepared conformal silicon oxide multi-layer film having sub-layers (each 75 Å thick) was found to have a larger WERR of 5.72. This establishes that plasma treatment has a limit on the depth of treatment penetration. Thinner sub-layers are densified more completely than thicker sub-layers. Three more pairs of conformal silicon oxide multi-layers were formed with plasma treatment gases of ozone, helium and argon. The two pairs of multi-layers processed with ozone and helium plasmas were similar in WERR to one another. Argon plasmas produced lower WERR films and the nitrogen plasma, for comparison, resulted in higher WERR films. In a preferred embodiment, the plasma treatment gas comprises argon. Generally speaking, the plasma treatment gas may comprise a combination of these exemplary gases but may also comprise other gases since the chemical reactivity does not appear to play a central role.

The pattern loading was quantified by comparing the horizontal growth of the conformal silicon oxide multi-layer from a vertical feature in a sparsely patterned region and a densely patterned region. An exemplary densely patterned region may have greater number of features than a sparsely patterned region to create the greater exposed surface area within a same area viewed from above the patterned substrate. A densely patterned region may have an exposed vertical area greater than a sparsely patterned region by a multiplicative factor greater than one of 2, 3, 5, 10 or 20, in disclosed embodiments. The thickness of the conformal silicon oxide multi-layer in a densely patterned region may be within one of 20%, 15%, 10%, 5% and 3% of the thickness of the conformal silicon oxide multi-layer in a sparsely patterned region, in embodiments of the invention. The thickness in each region may be measured on vertical surfaces in which case the growth is in a horizontal direction. Alternatively, the thickness may be measured on a horizontal surface within each region and the growth may then be in the vertical direction. The terms "vertical" and "horizontal" are used throughout to include substantially vertical and substantially horizontal directions which may or may not deviate from the theoretical vertical and horizontal by up to about 10 degrees.

Exemplary Substrate Processing System

Deposition chambers that may implement embodiments of the present invention may include sub-atmospheric chemical vapor deposition (SACVD) chambers and more generally, deposition chambers which allow operation at relatively high pressures without necessarily applying plasma excitation. Specific examples of CVD systems that may implement embodiments of the invention include the CENTURA ULTIMA® SACVD chambers/systems, and PRODUCER® HARP, eHARP and SACVD chambers/systems, available from Applied Materials, Inc. of Santa Clara, Calif.

Figure 3:
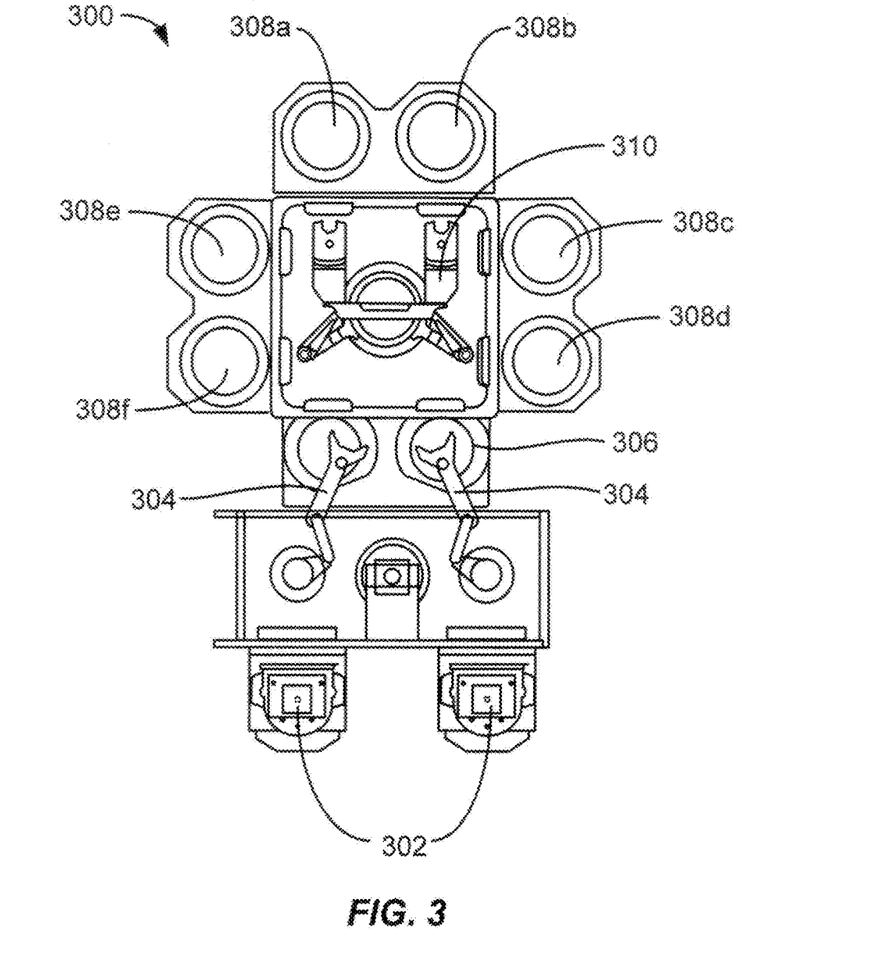
FIG. 3 shows a substrate processing system according to embodiments of the invention.

Embodiments of the deposition systems may be incorporated into larger fabrication systems for producing integrated circuit chips. FIG. 3 shows one such system 300 of deposition, baking and curing chambers according to disclosed embodiments. In the figure, a pair of FOUPs (front opening unified pods) 302 supply substrate substrates (e.g., 300 mm diameter wafers) that are received by robotic arms 304 and placed into a low pressure holding area 306 before being placed into one of the substrate processing chambers 308a-f. A second robotic arm 310 may be used to transport the substrate wafers from the holding area 306 to substrate processing chambers 308a-f and back.

Substrate processing chambers 308a-f may include one or more system components for depositing, annealing, curing and/or etching a dielectric film on the substrate wafer. In one configuration, two pairs of the processing chamber (e.g., 308c-d and 308e-f) may be used to deposit the dielectric material on the substrate, and the third pair of processing chambers (e.g., 308a-b) may be used to treat the deposited dielectic with a plasma. In another configuration, the same two pairs of processing chambers (e.g., 308c-d and 308e-f) may be configured to both deposit and plasma treat a deposited dielectric film on the substrate, while the third pair of chambers (e.g., 308a-b) may be used for UV or E-beam curing of the deposited film. In still another configuration, all three pairs of chambers (e.g., 308a-f) may be configured to deposit and cure a dielectric film on the substrate. In yet another configuration, two pairs of processing chambers (e.g., 308c-d and 308e-f) may be used for both deposition and UV or E-beam curing of the dielectric, while a third pair of processing chambers (e.g. 308a-b) may be used for annealing the dielectric film. Any one or more of the processes described may be carried out on chamber(s) separated from the fabrication system shown in disclosed embodiments.

Figure 4A:
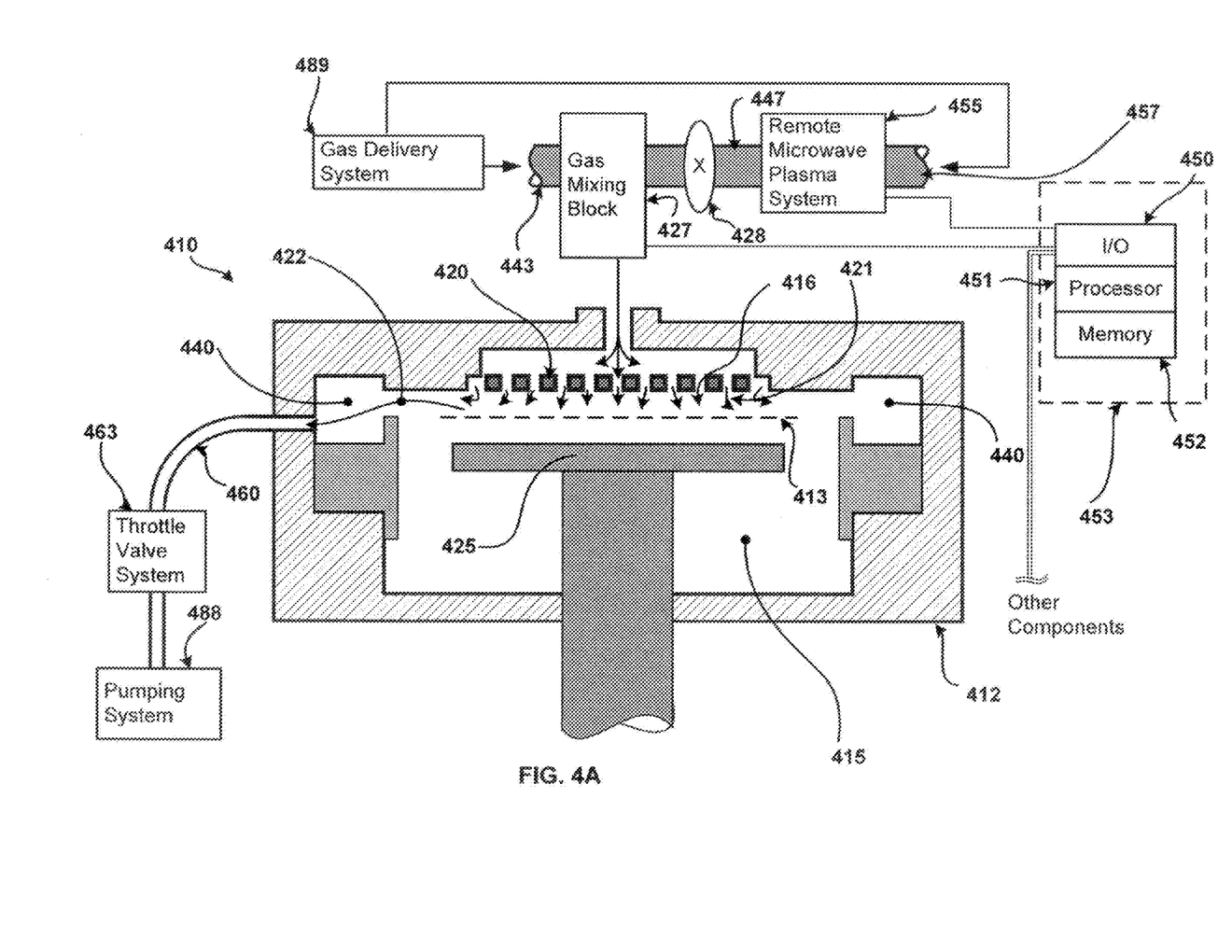
FIG. 4A shows a simplified representation of a semiconductor processing chamber according to embodiments of the present invention.

FIG. 4A shows a simplified representation of an exemplary substrate processing chamber within a substrate processing system 300. This exemplary substrate processing chamber 410 is suitable for performing a variety of semiconductor processing steps which may include CVD processes, as well as other processes, such as reflow, drive-in, cleaning, etching, and gettering processes. Multiple-step processes can also be performed on a single substrate without removing the substrate from the chamber. Representative major components of the system include a chamber interior 415 that receives process and other gases from a gas delivery system 489, pumping system 488, a remote plasma system (RPS) 455, and a system controller 453. These and other components are described below in order to understand the present invention.

Substrate processing chamber 410 includes an enclosure assembly 412 housing a chamber interior 415 with a gas reaction area 416. A gas distribution plate 420 is provided above the gas reaction area 416 for dispersing reactive gases and other gases, such as purge gases, through perforated holes in the gas distribution plate 420 to a substrate (not shown) that rests on a vertically movable heater 425 (which may also be referred to as a substrate support pedestal). Vertically movable heater 425 can be controllably moved between a lower position, where a substrate can be loaded or unloaded, for example, and a processing position closely adjacent to the gas distribution plate 420, indicated by a dashed line 413, or to other positions for other purposes, such as for an etch or cleaning process. A center board (not shown) includes sensors for providing information on the position of the substrate.

Gas distribution plate 420 may be of the variety described in U.S. Pat. No. 6,793,733. These plates improve the uniformity of gas disbursement at the substrate and are particularly advantageous in deposition processes that vary gas concentration ratios. In some examples, the plates work in combination with the vertically movable heater 425 (or movable substrate support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher).

In other examples, the orifices of the gas distribution plate are designed to provide more uniform mixing of the gases.

Vertically movable heater 425 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of vertically movable heater 425 exposed within the chamber interior 415 are made of a ceramic material, such as aluminum oxide ($Al_2O_3$ or alumina) or aluminum nitride.

Reactive and carrier gases are supplied through process gas supply line 443 into a gas mixing box (also called a gas mixing block) 427, where they are preferably mixed together and delivered to the gas distribution plate 420. The gas mixing block 427 is preferably a dual input mixing block coupled to a process gas supply line 443 and to a cleaning/etch gas conduit 447. A gate valve 428 operates to admit or seal gas or plasma from cleaning/etch gas conduit 447 to the gas mixing block 427. The cleaning/etch gas conduit 447 receives gases from a remote plasma system (RPS 455), which has an input line 457 for receiving input gases. During deposition processing, gas supplied to gas distribution plate 420 is vented toward the substrate surface (as indicated by arrows 421), where it may be uniformly distributed radially across the substrate surface, typically in a laminar flow.

Purging gas may be delivered into the chamber interior 415 through the gas distribution plate 420 and/or an inlet port or tube (not shown) through a wall (preferably the bottom) of enclosure assembly 412. The purging gas flows upward from the inlet port past vertically movable heater 425 and to an annular pumping channel 440. An exhaust system then exhausts the gas (as indicated by arrow 422) into the annular pumping channel 440 and through an exhaust line 460 to a pumping system 488, which includes one or more vacuum pumps. Exhaust gases and entrained particles are drawn from the annular pumping channel 440 through the exhaust line 460 at a rate controlled by a throttle valve system 463.

The RPS 455 can produce a plasma for selected applications, such as chamber cleaning or etching native oxide or residue from a process substrate. Plasma species produced in RPS 455 from precursors supplied via the input line 457 are sent via cleaning/etch gas conduit 447 for dispersion through the gas distribution plate 420 to the gas reaction area 416. Precursor gases for a cleaning application may include fluorine, chlorine, and other reactive elements. The RPS 455 also may be adapted to deposit plasma enhanced CVD films by selecting appropriate deposition precursor gases for use in the RPS 455.

The system controller 453 controls activities and operating parameters of the deposition system. The processor 451 executes system control software, such as a computer program stored in a memory 452 coupled to the processor 451. The memory 452 typically consists of a combination of static random access memories (cache), dynamic random access memories (DRAM) and hard disk drives but of course the memory 452 may also consist of other kinds of memory, such as solid-state memory devices. In addition to these memory means the substrate processing chamber 410 in a preferred embodiment includes a removable storage media drive, USB ports and a card rack (not shown).

The processor 451 operates according to system control software programmed to operate the device according to the methods disclosed herein. For example, sets of instructions may dictate the timing, mixture of gases, chamber pressure, chamber temperature, plasma power levels, susceptor position, and other parameters of a particular process. The instructions are conveyed to the appropriate hardware preferably through direct cabling carrying analog or digital signals conveying signals originating from an input-output I/O module 450. Other computer programs such as those stored on other memory including, for example, a USB thumb drive, a floppy disk or another computer program product inserted in a disk drive or other appropriate drive, may also be used to operate the processor 451 to configure the substrate processing chamber 410 for varied uses.

The processor 451 may have a card rack (not shown) that contains a single-board computer, analog and digital input/output boards, interface boards and stepper motor controller boards. Various parts of the semiconductor processing system 300 conform to the Versa Modular European (VME) standard which defines board, card cage, and connector dimensions and types. The VME standard also defines the bus structure having a 16-bit data bus and 24-bit address bus.

A process for depositing a conformal silicon oxide multi-layer on a patterned substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The embodiment disclosed herein relies on direct cabling and a single processor 451. Alternative embodiments comprising multi-core processors, multiple processors under distributed control and wireless communication between the system controller and controlled objects are also possible.

Figure 4B:
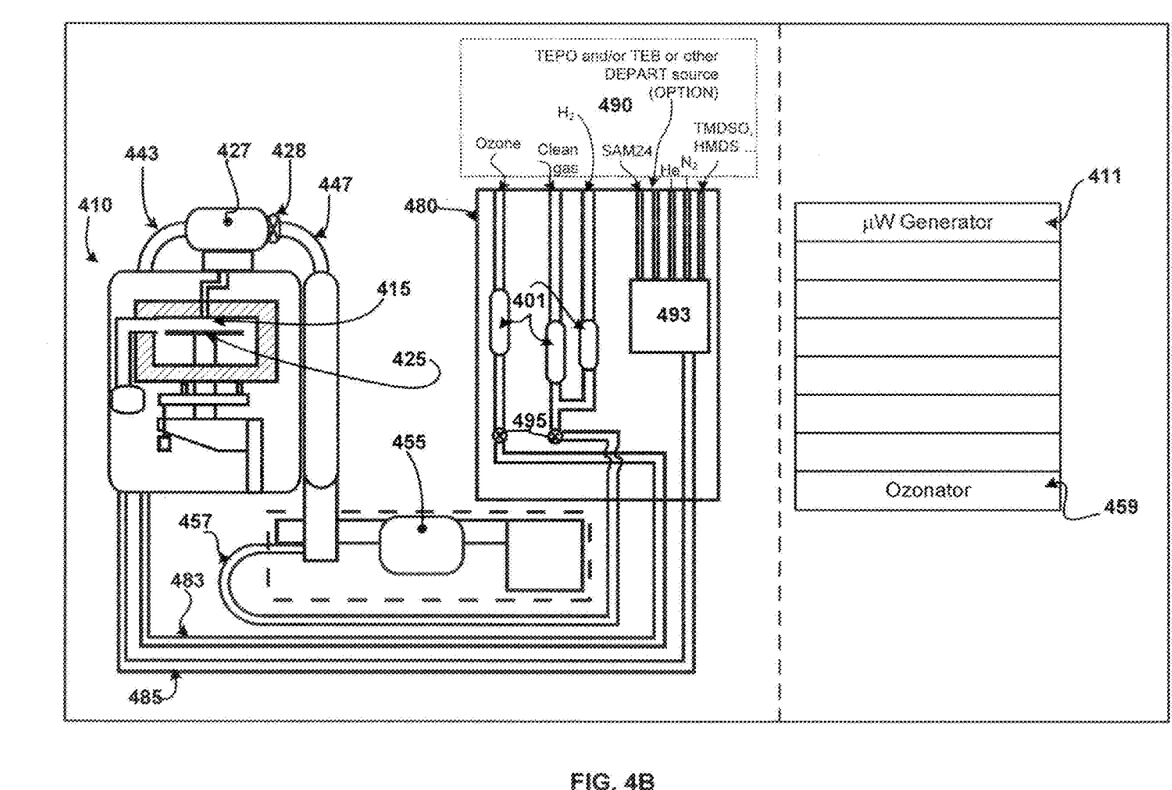
FIG. 4B shows a simplified representation of a gas panel and supply lines in relation to a processing chamber.

FIG. 4B shows a simplified representation of a gas supply panel 480 in relation to substrate processing chamber 410. As discussed above, the portion of semiconductor processing system 300 shown includes substrate processing chamber 410 with vertically movable heater 425, a gas mixing block 427 with inputs from process gas supply line 443 and cleaning/etch gas conduit 447, and RPS 455 with input line 457. As mentioned above, the gas mixing block 427 is configured for mixing and injecting deposition gas(es) and cleaning gas(es) or other gas(es) through the process gas supply line 443 and the input line 457 to the chamber interior 415.

The RPS 455 is integrally located and mounted below the substrate processing chamber 410 with cleaning/etch gas conduit 447 coming up alongside substrate processing chamber 410 to the gate valve 428 and the gas mixing block 427, located above substrate processing chamber 410. Plasma power generator 411 and ozonator 459 are located remote from the clean room. Supply lines 483 and 485 from the gas supply panel 480 provide reactive gases to process gas supply line 443. The gas supply panel 480 includes lines from gas or liquid sources 490 that provide the process gases for the selected application. The gas supply panel 480 has a gas mixing system 493 that mixes selected gases before flow to the gas mixing block 427. In some embodiments, gas mixing system 493 includes a liquid injection system for vaporizing one or more reactant liquids such as BDEAS, tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 495 that can be used to automatically or manually shut off the flow of process gas into supply line 485 or input line 457, and (ii) liquid flow meters (LFM) 401 or other types of controllers that measure the flow of gas or liquid through the supply lines.

As an example, a mixture including BDEAS as a silicon source may be used with gas mixing system 493 in a deposition process for forming a silicon oxide film. Sources of dopants such as phosphorous and boron may include TEPO and TEB which may also be introduced to gas mixing system 493. Precursors delivered to gas mixing system 493 may be liquid at room temperature and pressure and may be vaporized by conventional boiler-type or bubbler-type hot boxes. Alternatively, a liquid injection system may be used and offers greater control of the volume of reactant liquid introduced into the gas mixing system. The liquid is typically injected as a fine spray or mist into the carrier gas flow before being delivered to a heated gas supply line 485 to the gas mixing block and chamber. Oxygen ($O_2$) flows to the chamber through supply line 483, to be combined with the reactant gases from heated gas supply line 485 near or in the chamber. Of course, it is recognized that other sources of dopants, silicon, oxygen and additive precursors may also be used. Though shown as an individual gas supply line, supply line 485 may actually comprise multiple lines separated to discourage inter-precursor reactions before the precursors are flowed into chamber interior 415.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include minority concentrations of other elemental constituents such as nitrogen, hydrogen, carbon and the like. A gas may be a combination of two or more gases. The terms trench and gap are used throughout with no implication that the etched geometry necessarily has a large horizontal aspect ratio. Viewed from above the surface, gaps may appear circular, oval, polygonal, rectangular, or a variety of other shapes. Gaps may also be a region between two pillars in which case the gaps are not physical separate from other gaps. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a conformal silicon oxide multi-layer on a patterned substrate in a substrate processing region of a processing chamber, wherein the patterned substrate has a densely patterned region and a sparsely patterned region, the method comprising sequential steps of:

performing a first cycle of chemical vapor deposition comprising the operations:
flowing BDEAS into the substrate processing region,
flowing a first oxygen-containing precursor into the substrate processing region, wherein the operations of flowing the BDEAS and flowing the first oxygen-containing precursor are concurrent, and
forming a first conformal silicon oxide sub-layer of the conformal silicon oxide multi-layer on the patterned substrate from the BDEAS and the first oxygen-containing precursor by chemical vapor deposition;
removing unreacted and partially-reacted precursors from the substrate processing region; and
performing a second cycle of chemical vapor deposition comprising the operations:
flowing BDEAS into the substrate processing region,
flowing a second oxygen-containing precursor into the substrate processing region, and
forming a second conformal silicon oxide sub-layer of the conformal silicon oxide multi-layer on the patterned substrate from the BDEAS and the second oxygen-containing precursor by chemical vapor deposition,
wherein a thickness of the first conformal silicon oxide sub-layer is about 100 Å or less.

2. The method of claim 1 wherein flowing the first and second oxygen-containing precursors into the substrate processing region comprises flowing molecular oxygen into the substrate processing region.

3. The method of claim 2 wherein the first and second oxygen-containing precursors consists essentially of molecular oxygen ($O_2$).

4. The method of claim 2 wherein the first and second oxygen-containing precursors contains essentially no ozone ($O_3$).

5. The method of claim 1 wherein flowing the first and second oxygen-containing precursors comprise flowing molecular oxygen and ozone into the substrate processing region.

6. The method of claim 5 wherein a flow rate of the ozone is less than about 300 sccm.

7. The method of claim 1 wherein a first thickness of the conformal silicon oxide multi-layer in the densely patterned region is within 10% of a second thickness in the sparsely patterned region.

8. The method of claim 7 wherein the first and second thicknesses are measured on a substantially-vertical surface of the patterned substrate, wherein the substantially-vertical surface is substantially perpendicular to the patterned substrate.

9. The method of claim 7 wherein the two thicknesses of the conformal silicon oxide multi-layer in the densely and sparsely patterned regions are measured on a substantially-horizontal surface of the patterned substrate.

10. The method of claim 1 wherein a first thickness of the conformal silicon oxide multi-layer in the densely patterned region is within 3% of a second thickness in the sparsely patterned region.

11. The method of claim 1 wherein the operation of flowing BDEAS comprises flowing BDEAS at a rate greater than or about 100 mg/min.

12. The method of claim 1 further comprising treating the first conformal silicon oxide sub-layer with a plasma after performing the first cycle and before performing the second cycle of chemical vapor deposition.

13. The method of claim 12 wherein the plasma is formed from at least one of argon, helium, ozone or nitrogen ($N_2$).

14. The method of claim 12 wherein the plasma is formed using a frequency greater than or about 5 MHz and a power greater than or about 300 Watts.

15. The method of claim 1 wherein a pressure in the substrate processing region during formation of the first conformal silicon oxide sub-layer is below or about 350 Torr.

16. The method of claim 1 wherein a temperature of the patterned substrate during formation of the first conformal silicon oxide sub-layer is below or about 400° C.

17. The method of claim 1 wherein the thickness of the first conformal silicon oxide sub-layer is about 50 Å or less.

18. The method of claim 1 wherein an average exposed substantially-vertical area prior to deposition in the densely patterned region exceeds that of the sparsely patterned region by a multiplicative factor of about 2.

19. The method of claim 1 further comprising an operation of flowing a carrier gas which carries the BDEAS into the substrate processing region during the first cycle of chemical vapor deposition.

* * * * *